(12) United States Patent
Laster (10) Patent No.: US 9,549,478 B2
(45) Date of Patent: Jan. 17, 2017

(54) MOUNTING BRACKET FOR A MARINE DISPLAY

(71) Applicant: Navico Holding AS, Egersund (NO)

(72) Inventor: Matthew Laster, Broken Arrow, OK (US)

(73) Assignee: NAVICO HOLDING AS, Egersund (NO)

( * ) Notice: Subject to any disclaimer, the term of this patent is extended or adjusted under 35 U.S.C. 154(b) by 30 days.

(21) Appl. No.: 14/628,157

(22) Filed: Feb. 20, 2015

(65) Prior Publication Data
US 2016/0249468 A1  Aug. 25, 2016

(51) Int. Cl.
| | | |
|---|---|---|
| *H05K 7/00* | (2006.01) | |
| *H05K 5/00* | (2006.01) | |
| *G11B 33/02* | (2006.01) | |
| *H05K 5/02* | (2006.01) | |
| *B63B 49/00* | (2006.01) | |

(52) U.S. Cl.
CPC ............. *H05K 5/0217* (2013.01); *B63B 49/00* (2013.01)

(58) Field of Classification Search
CPC .......................................................... G06F 1/16
USPC ..................................................... 361/679.01
See application file for complete search history.

(56) References Cited

U.S. PATENT DOCUMENTS

2008/0130251 A1* 6/2008 Tanaka ................. G06F 1/1616
                                                    361/749
2013/0286578 A1* 10/2013 Degner ................ G06F 1/1681
                                                    361/679.28

FOREIGN PATENT DOCUMENTS

JP            09249077 A  *  9/1997

* cited by examiner

*Primary Examiner* — Jerry Wu
(74) *Attorney, Agent, or Firm* — Nelson Mullins Riley & Scarborough LLP (57) ABSTRACT

Various implementations described herein are directed to a device configured for mounting a marine display to a vessel. The device may include a bracket having a housing with a compartment for receiving a power source. The device may include an electrical circuit configured to connect the power source to the multi-function display.

20 Claims, 7 Drawing Sheets

MOUNTING BRACKET FOR A MARINE DISPLAY

BACKGROUND

This section is intended to provide information to facilitate an understanding of various technologies described herein. As the section's title implies, this is a discussion of related art. That such art is related in no way implies that it is prior art. The related art may or may not be prior art. It should therefore be understood that the statements in this section are to be read in this light, and not as admissions of prior art.

When trolling, marine displays are used to locate fish. Typically, conventional marine displays rely on remote power wired in from elsewhere on a vessel. For some vessels, remote power may be difficult to implement.

SUMMARY

Described herein are implementations of various technologies for a device configured to mount a multi-function display to a marine vessel. The device may include a bracket having a housing with a compartment for receiving a power source. The device may include an electrical circuit configured to connect the power source to the multi-function display.

Described herein are also implementations of various technologies for a bracket having a base configured to mount a computing device to a watercraft. The base may include an inner compartment configured to receive a power source. The bracket may include a first member extending from the base for mounting a first part of the computing device to the base. The first member may include a first aperture with a first electrode configured to receive a first connector of the computing device. The bracket may include a second member extending from the base for mounting a second part of the computing device to the base. The second member may include a second aperture with a second electrode configured to receive a second connector of the computing device. The bracket may include an electrical circuit configured to electrically connect the power source to the computing device via electrical connection between the first electrode of the first member and the first connector of the computing device and via electrical connection between the second electrode of the second member and the second connector of the computing device.

Described herein are also implementations of various technologies for a bracket having a base member configured to fasten a marine display to a watercraft. The base member may include an interior compartment configured to receive a power source. The bracket may include at least one arm member extending from the base member for mounting at least a portion of the marine display to the base member. The at least one arm member may include a first electrode terminal configured to electrically connect to a first electrical contact of the marine display and a second electrode terminal configured to electrically connect to a second electrical contact of the marine display. The bracket may include an electrical circuit configured to connect the power source to the marine display via electrical connection between the first electrode terminal and the first electrical contact and via electrical connection between the second electrode terminal and the second electrical contact.

The above referenced summary section is provided to introduce a selection of concepts in a simplified form that are further described below in the detailed description section. The summary is not intended to identify key features or essential features of the claimed subject matter, nor is it intended to be used to limit the scope of the claimed subject matter. Moreover, the claimed subject matter is not limited to implementations that solve any or all disadvantages noted in any part of this disclosure.

BRIEF DESCRIPTION OF THE DRAWINGS

Implementations of various techniques will hereafter be described with reference to the accompanying drawings. It should be understood, however, that the accompanying drawings illustrate only the various implementations described herein and are not meant to limit the scope of various techniques described herein.

DETAILED DESCRIPTION

Various implementations described herein are directed to a mounting bracket for a marine display, such as, e.g., a marine electronics device, a multi-function display (MFD), etc. Some techniques described herein refer to a gimbal type bracket having an inner pocket or hollow cavity with an internal power source (e.g., embedded or built-in battery cell pack) coupled therein. The bracket may route power from the internal power source into the marine display through connection points (e.g., electrodes, terminals, or contacts) positioned on either side of the marine display. This electrical connection may be achieved through use of dedicated electrical connections in a mounting circle (e.g., aperture) or through a conductive fastener (e.g., metal screw) that passes through the bracket and fastens to the marine display. The bracket may be attached and detached from a vessel for charging and/or recharging the power source.

Various implementations of a mounting bracket for a marine display will now be described in reference to FIGS. 1-5.

Figure 1:
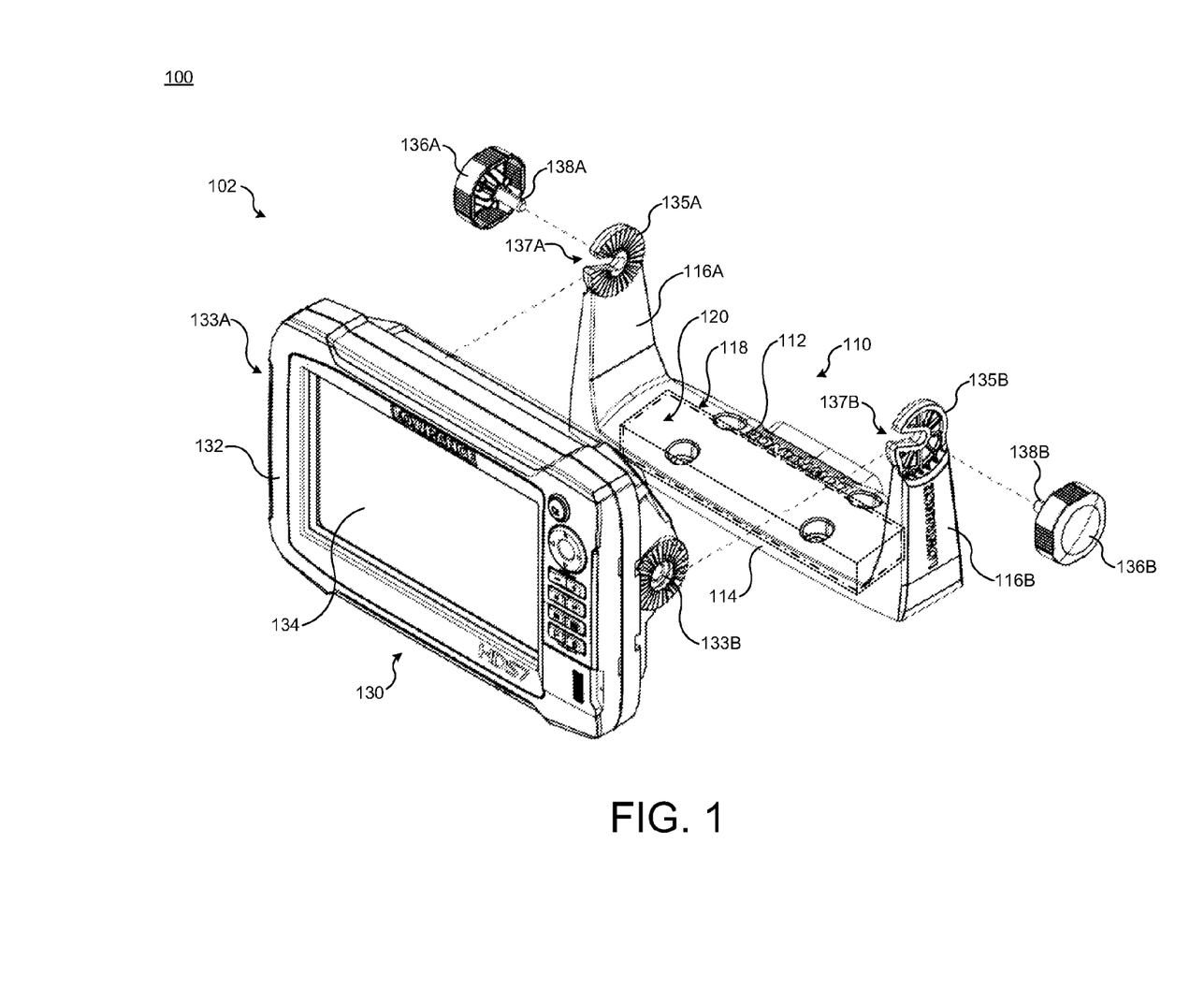
FIG. 1 illustrates a diagram of a mounting bracket assembly in accordance with various implementations described herein.

FIG. 1 illustrates a diagram 100 of a mounting bracket assembly 102 in accordance with various implementations described herein. In various implementations, the mounting bracket assembly 102 may include a mounting bracket 110 that may be configured to mount a marine display 130 (e.g., marine electronics device, MFD, etc.) to a vessel (e.g., watercraft, boat, ship, etc.). The mounting bracket 110 may be referred to simply as a bracket or device for mounting the marine display 130 to a vessel. The mounting bracket 110 may be referred to as a gimbal type bracket. In some instances, the bracket 110 may be mounted, fastened, coupled, and/or attached to the vessel with one or more fasteners and/or fastening agents, such as, e.g., screws, bolts, anchors, clips, snaps, adhesives, glue, tape, etc. In some other instances, the bracket 110 may be detachably mounted, fastened, coupled, and/or attached to a vessel with one or more detachable fasteners and/or detachable fastening agents, such as, e.g., screws, bolts, anchors, clips, snaps, tape, etc. In various implementations, the bracket 110 may include use of (and/or may be constructed, formed, molded, etc. with) various types of materials, such as, e.g., metal, plastic, wood, etc.

In reference to FIG. 1, the bracket 110 may comprise a housing 112 with a compartment 118, which may be referred to as an inner compartment formed within an interior or internal portion of the housing 112. In some implementations, the bracket 110 may include a base 114 having the compartment 118 formed therein, and further, the compartment 118 may be formed as a hollow cavity and configured to receive a power source 120, such as, one or more batteries in a battery pack or something similar. The compartment 118 may be configured to hold and/or retain the power source 120 within a recess defined by the hollow cavity. As such, in this instance, the power source 120 inside the compartment 118 may be configured to couple to the housing 112. The power source 120 may be referred to as an internal power source (e.g., embedded or built-in power source). Further, an electrical circuit (not shown) may be provided in the form of, e.g., a conductive wire or trace, and may be configured to electrically connect the power source 120 to the marine display 130, in a manner as further described herein.

As shown in FIG. 1, the housing 112 may include one or more arms or members extending from the base 114 for coupling to the marine display 130. For instance, the housing 112 may include a first arm 116A extending from the base 114 for coupling to a first connector 136A (e.g., a first conductive fastener or knob, such as a first metal screw or bolt having a knob portion) of the marine display 130, and the housing 112 may include a second arm 116B extending from the base 114 for coupling to a second connector 136B (e.g., a second conductive fastener or knob, such as a second metal screw or bolt having knob portions) of the marine display 130. In some instances, the first arm 116A may include a first end portion or first mounting circle 135A with a first mounting aperture 137A formed therein, and the second arm 116B may include a second end portion or second mounting circle 135B with a second mounting aperture 137B formed therein. The first and second connectors 136A, 136B may each include removable connectors or knobs, such as removable conductive fasteners or knobs (e.g., metal screws or bolts having knob portions) that may be configured to engage and disengage from the marine display 230.

Further, as shown in FIG. 1, the marine display 130 may be coupled to the bracket 110 with the first and second connectors 136A, 136B. In this instance, the first connector 136A may include a first threaded shaft 138A configured to extend through the first mounting aperture 137A of the first arm 116A and couple with a first fastening aperture 133A formed as a first threaded recess in a side portion of a housing 132 of the marine display 130. The second connector 136B may include a second threaded shaft 138B configured to extend through the second mounting aperture 137B of the second arm 116B and couple with a second fastening aperture 133B formed as a second threaded recess in another side portion of the housing 132 of the marine display 130. Further, the marine display 130 may be manually tightened and/or loosened to the bracket 110 by rotation of the first and second connectors 136A, 136B, which may include removable connectors that may be configured to engage and disengage from corresponding threaded recesses of the marine display 230. Further, when coupled to the bracket 110, the marine display 130 may pivot or tilt with respect to the bracket 110 along a horizontal axis formed between the first and second connectors 136A, 136B to change a viewing angle of a screen 134 of the marine display 130.

In various implementations, the power source 120 may include one or more batteries configured to activate and provide power to the marine display 130. In some instances, the power source 120 may be configured to provide approximately 12V and up to 3 A to the marine display 130. However, in various instances, the power source 120 may be configured to provide any amount of voltage and/or amperes to the marine display 130, depending on particular power conditions, demands, and/or specifications of the marine display 130. In some instances, the power source 120 may include one or more primary cells or non-rechargeable batteries, such as, e.g., Alkaline, etc. In some other instances, the power source 120 may include one or more secondary cells or rechargeable batteries, such as, e.g., Lead-acid, Ni-cad, Lithium-ion, etc. The bracket 110 may be detached from a vessel for recharging the power source 120.

In various implementations, the marine display 130 may include a computing device, such as, e.g., a special purpose machine for interfacing with various marine based devices, instruments, and/or components. For instance, the marine display 130 may include a marine electronics device having a display, such as, e.g., a multi-function display (MFD), smart phone, mobile computer, etc. The marine display 130 may include various standard elements and/or components, including a processor, memory (e.g., non-transitory computer-readable storage medium), a database, power, peripherals, and various other computing components. The marine display 130 may include the housing 132 configured to encapsulate the computing components and the screen 134 (e.g., monitor or other computer display screen) that may be used to provide a user interface (UI), including a graphical user interface (GUI). The UI may be used to receive one or more preferences from a user of the marine display 130 for managing or utilizing data and information displayed on the screen 134. In this instance, a user may setup desired behavior of the marine display 130 via user-selected preferences using the UI associated therewith. Various elements and/or components of the marine display 130 that may be useful for the purpose of implementing the marine display 130 may be added, included, and/or interchanged, in manner as described herein.

Figure 2A:
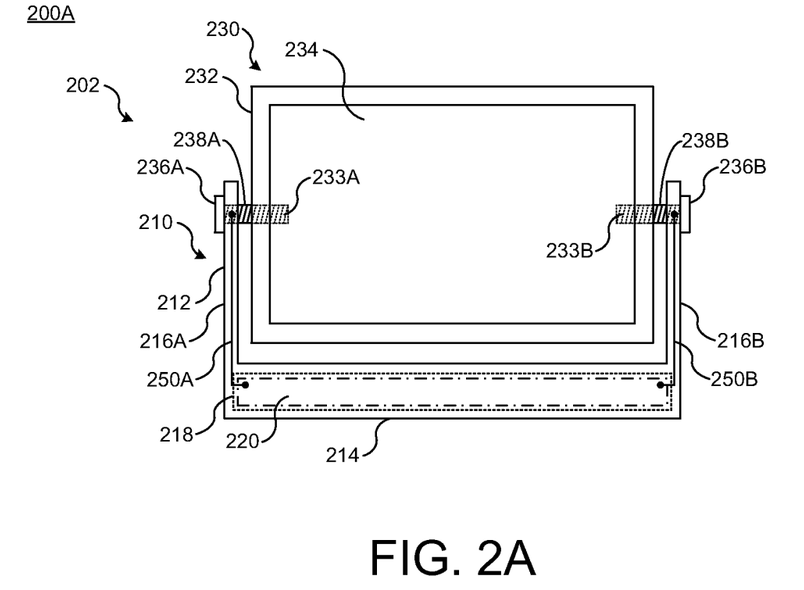
FIGS. 2A-2F illustrate various views of a mounting bracket assembly in accordance with various implementations described herein.
Figure 2B:
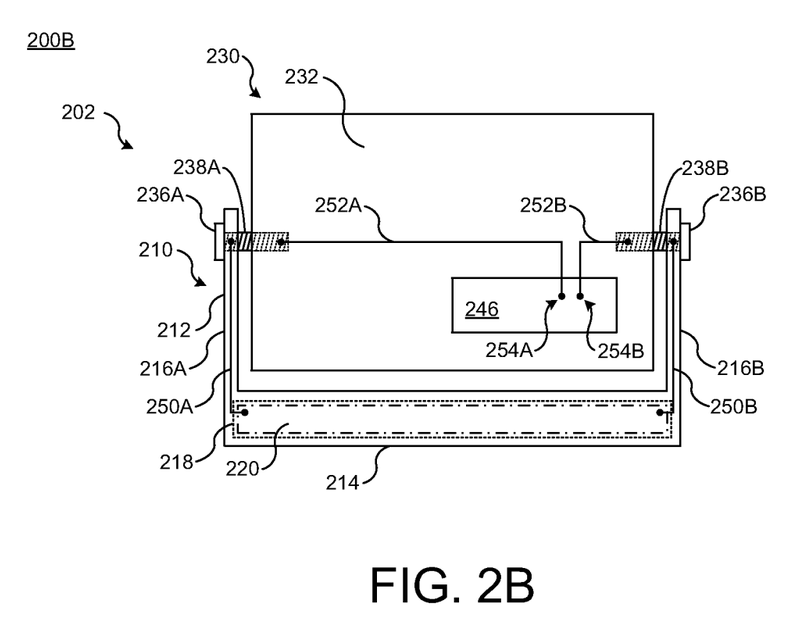
Figure 2C:
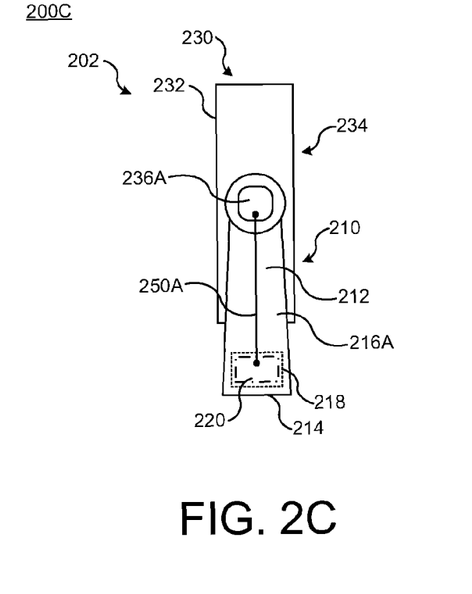
Figure 2D:
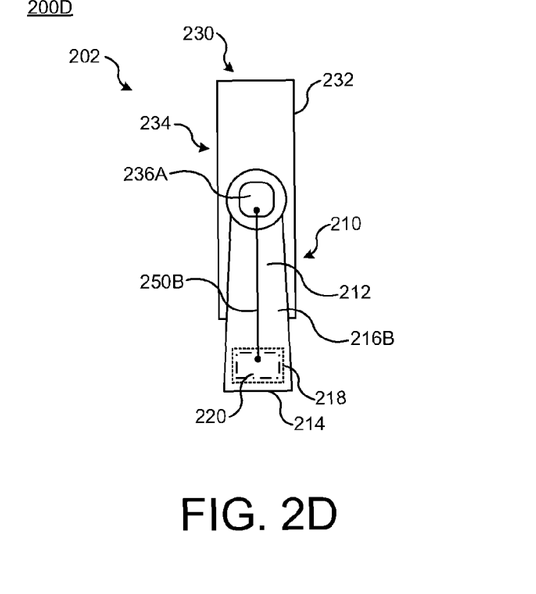
Figure 2E:
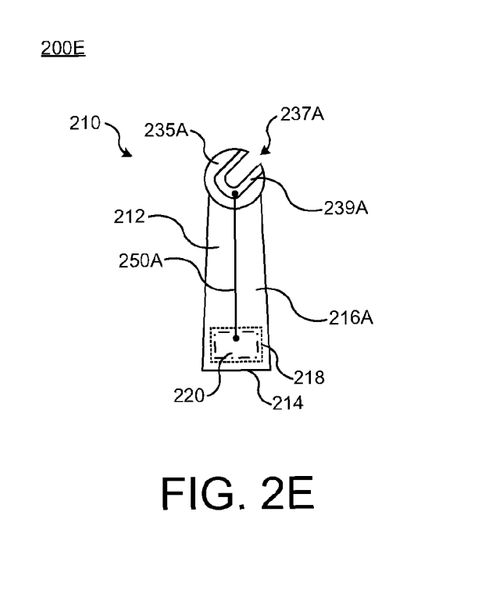
Figure 2F:
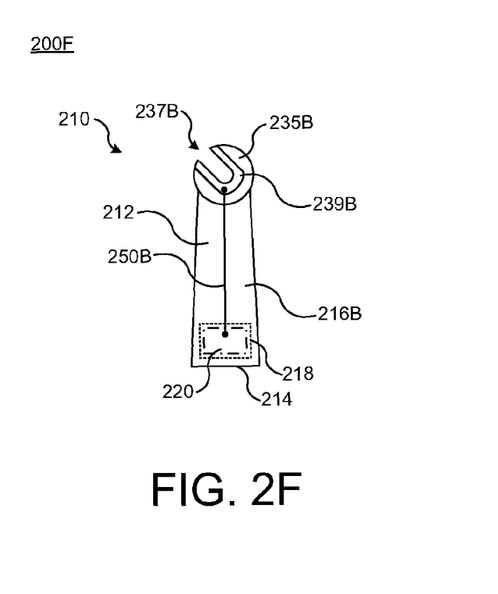

FIGS. 2A-2F illustrate various views of a mounting bracket assembly 202 in accordance with various implementations described herein. In particular, FIG. 2A illustrates a front view 200A of the mounting bracket assembly 202, FIG. 2B illustrates a back view 200B of the mounting bracket assembly 202, FIG. 2C illustrates a left side view 200C of the mounting bracket assembly 202, and FIG. 2D illustrates a right side view 200D of the mounting bracket assembly 202. Further, FIG. 2E illustrates another left side view 200E of a bracket 210 of the mounting bracket assembly 202 without a marine display 230 mounted to the bracket 210, and FIG. 2F illustrates another right side view 200F of the bracket 210 of the mounting bracket assembly 202 without the marine display 230 mounted to the bracket 210.

In various implementations, the mounting bracket assembly 202 may include the bracket 210 configured for mounting the marine display 230 (e.g., marine electronics device, MFD, etc.) to a vessel (e.g., watercraft, boat, ship, etc.). The bracket 210 may be referred to as a mounting bracket. The mounting bracket 110 may be referred to as a gimbal type bracket.

In various implementations, as shown in FIGS. 2A-2F, the power source 220 may be embedded in the bracket 210 and configured to activate and provide power to the marine display 230. In some instances, the power source 220 may be configured to provide a range of power between 0V and 18V and between 0 A to 6 A to the marine display 230. In various other instances, the power source 220 may be configured to provide any amount of voltage and/or amperes to the marine display 230, depending on various desired power conditions, demands, and/or specifications of the marine display 230.

In various implementations, as shown in FIGS. 2A-2F, the electrical circuit may include conductive electrical wires or traces, including a first wire or trace 250A, a second wire or trace 250B, a third wire or trace 252A, and a fourth wire or trace 252B, that may be configured to form a closed loop circuit. In some instances, each of these conductive electrical wires or traces 250A, 250B, 252A, 252B may be embedded within portions, parts, and/or members of the housing 212 of the bracket 210.

For instance, as shown in FIGS. 2A-2C, the first wire or trace 250A may be configured to pass through the first arm member 216A and electrically connect the power source 220 to the first connector 236A of the marine display 230. Further, in this instance, the first connector 236A may be formed of an electrically conductive material that provides a conductive path or route between the first wire or trace 250A and the third wire or trace 252A. As shown in FIG. 2B, this electrical connection may provide a first circuit path or route between the power source 220 and a first electrode terminal or contact 254A of a power bus 246 of the marine display 230. Further, as shown in FIG. 2E, the first arm member 216A may include the first end portion 235A with the first mounting aperture 237A and a first electrode terminal or contact 239A integrated with the first mounting aperture 237A formed therein. In this instance, the first electrode terminal or contact 239A may be configured to electrically connect with the first connector 236A of the marine display 230.

In another instance, as shown in FIGS. 2A, 2C, and 2D, the second wire or trace 250B may be configured to pass through the second arm member 216B and electrically connect the power source 220 to the second connector 236B of the marine display 230. Further, in this instance, the second connector 236B may be formed of an electrically conductive material that provides a conductive path or route between the second wire or trace 250B and the fourth wire or trace 252B. As shown in FIG. 2B, this electrical connection may provide a second circuit path or route between the power source 220 and a second electrode terminal or contact 254B of the power bus 246 of the marine display 230. Still further, as shown in FIG. 2F, the second arm member 216B may include the second end portion 235B with the second mounting aperture 237B and a second electrode terminal or contact 239B integrated with the second mounting aperture 237B formed therein. Further, in this instance, the second electrode terminal or contact 239B may be configured to electrically connect with the second connector 236B of the marine display 230.

In some implementations, the first electrode terminal 254A of the power bus 246 of the marine display 230 may be configured to electrically connect a positive (+) terminal of the power source 220 to a positive (+) terminal of the marine display 230. In these instances, the first electrode terminal 254A of the power bus 246 is the positive (+) terminal of the marine display 230. In some implementations, the second electrode terminal 254B of the power bus 246 of the marine display 230 may be configured to electrically connect a negative (−) terminal of the power source 220 to a negative (−) terminal of the marine display 230. In these instances, the second electrode terminal 254B of the power bus 246 is the negative (−) terminal of the marine display 230.

When the marine display 230 is mounted, fastened, coupled, and/or attached to the bracket 110, the power source 220 provides power to the marine display 230 via the electrical circuit formed by the closed loop of the first wire or trace 250A, the second wire or trace 250B, the third wire or trace 252A, and the fourth wire or trace 252B. In these instances, the first and second connectors 236A, 236B are configured to further provide the closed loop circuit path or route between the power source 220 and the power bus 246 of the marine display 230 when the marine display 230 is mounted, fastened, coupled, and/or attached to the bracket 110, in a manner as described herein in reference to FIGS. 2A-2F.

Figure 3A:
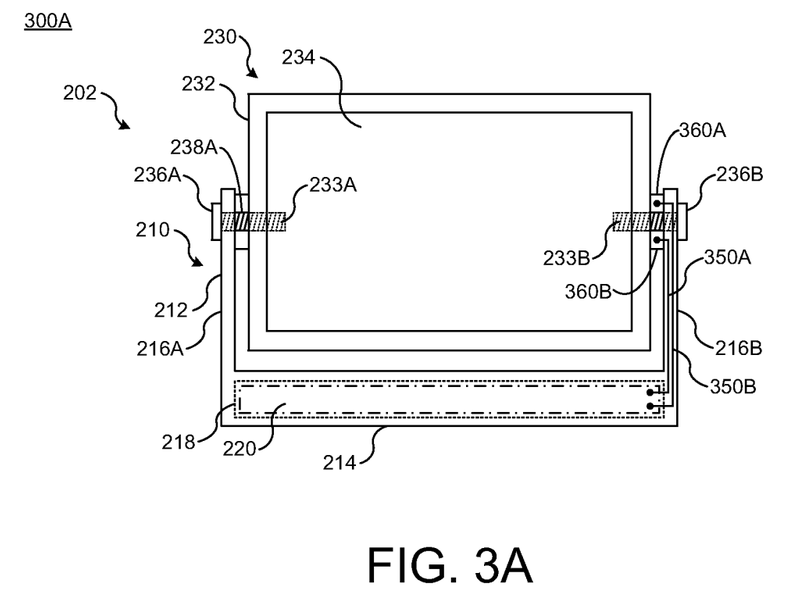
FIGS. 3A-3F illustrate various views of a mounting bracket assembly in accordance with various implementations described herein.
Figure 3B:
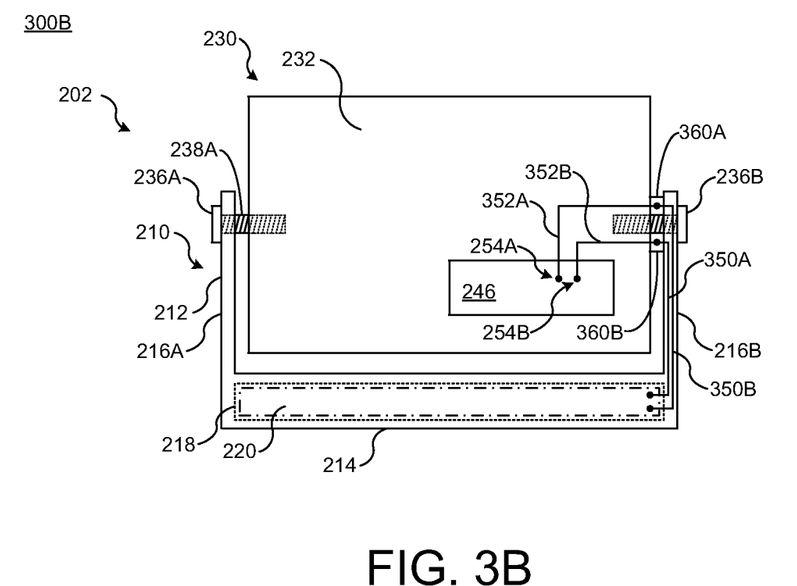
Figure 3C:
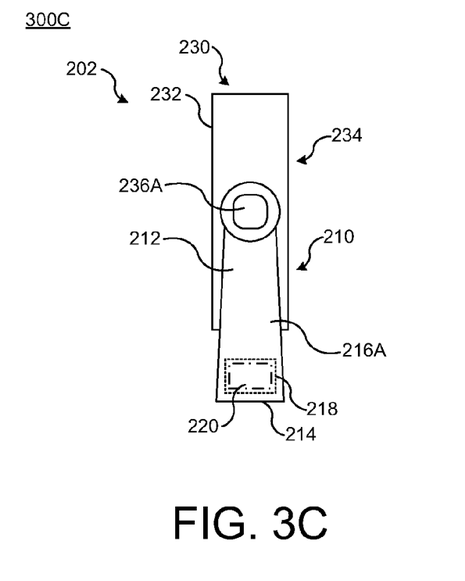
Figure 3D:
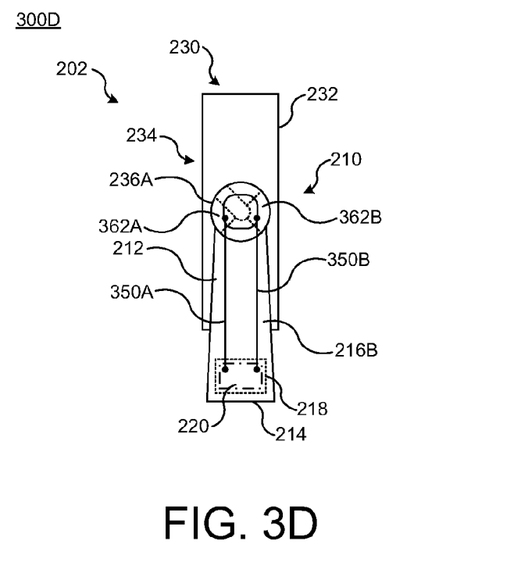
Figure 3E:
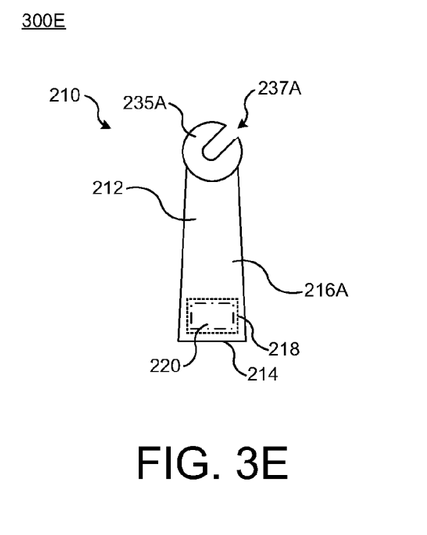
Figure 3F:
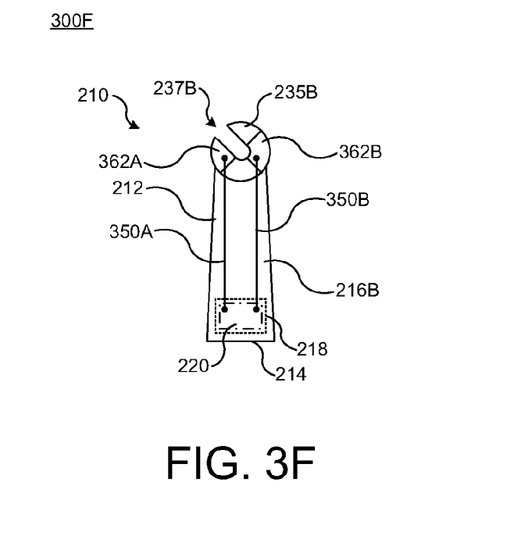

FIGS. 3A-3F illustrate various views of another embodiment of the mounting bracket assembly 202 in accordance with various implementations described herein. In particular, FIG. 3A illustrates a front view 300A of the mounting bracket assembly 202, FIG. 3B illustrates a back view 300B of the mounting bracket assembly 202, FIG. 3C illustrates a left side view 300C of the mounting bracket assembly 202, and FIG. 3D illustrates a right side view 300D of the mounting bracket assembly 202. FIG. 3E illustrates another left side view 300E of a bracket 210 of the mounting bracket assembly 202 without a marine display 230 mounted to the bracket 210, and FIG. 3F illustrates another right side view 300F of the bracket 210 of the mounting bracket assembly 202 without the marine display 230 mounted to the bracket 210. The mounting bracket assembly 202 in FIGS. 3A-3F may have similar elements and/or components as those described in reference to FIGS. 2A-2F.

In reference to FIGS. 3A-3F, the bracket 210 may comprise a housing 212 with an inner compartment 218 formed within an interior or internal region of the housing 212. As described herein, the bracket 210 may include a base member 214 having the inner compartment 218 formed therein, and the inner compartment 218 may be formed as a hollow cavity and configured to receive the power source 220. In this instance, the power source 220 may be configured to couple to the housing 212 within the inner compartment 218 of the base member 214. Further, in some instances, as shown in FIG. 3B, an electrical circuit 350A, 350B, 352A, 352B may be provided in the form of a conductive wire or trace and may be configured to electrically connect the power source 220 to the marine display 230. In some instances, each of these conductive electrical wires or traces 350A, 350B, 352A, 352B may be embedded within portions, parts, and/or members of the housing 212 of the bracket 210.

In various implementations, as shown in FIGS. 3A-3F, the electrical circuit may include conductive electrical wires or traces, including a first wire or trace 350A, a second wire or trace 350B, a third wire or trace 352A, and a fourth wire or trace 352B, that may be configured to form a closed loop circuit. As shown in FIGS. 3A-3B, the first wire or trace 350A and the second wire or trace 350B may be configured to pass through only one of the arm members, such as, e.g., the second arm member 216B, and electrically connect the power source 220 to the marine display 230 via first and second electrical contacts 360A, 360B. Further, in this instance, the first electrical contact 360A may be formed of an electrically conductive material that provides a conductive path or route between the first wire or trace 350A and the third wire or trace 352A. As shown in FIG. 3B, this electrical connection may provide a first circuit path or route between the power source 220 and the first electrode terminal or contact 254A of a power bus 246 of the marine display 230. Further, as shown in FIG. 3F, the second arm member 216B may include the first end portion 235B with the second mounting aperture 237B and a first electrode terminal or contact 362A integrated with the second mounting aperture 237B formed therein. In this instance, the first electrode terminal or contact 362A may be configured to electrically connect with the marine display 230 at a first position on the first end portion 235B.

Further, in this instance, the second electrical contact 360B may be formed of an electrically conductive material that provides a conductive path or route between the second wire or trace 350B and the fourth wire or trace 352B. As shown in FIG. 3B, this electrical connection may provide a second circuit path or route between the power source 220 and the second electrode terminal or contact 254B of a power bus 246 of the marine display 230. Further, as shown in FIG. 3F, the second arm member 216B may include the first end portion 235B with the second mounting aperture 237B and a second electrode terminal or contact 362B integrated with the second mounting aperture 237B formed therein. In this instance, the second electrode terminal or contact 362B may be configured to electrically connect with the marine display 230 at a second position on the first end portion 235B that is different than the first position. Further, in contrast to the implementations described in FIGS. 2A-2F, the first and second electrode terminals or contacts 362A, 362B are electrically isolated on the first end portion 235B.

In some implementations, the first electrode terminal 254A of the power bus 246 of the marine display 230 may be configured to electrically connect a positive (+) terminal of the power source 220 to a positive (+) terminal of the marine display 230. In these instances, the first electrode terminal 254A of the power bus 246 is the positive (+) terminal of the marine display 230. The second electrode terminal 254B of the power bus 246 of the marine display 230 may be configured to electrically connect a negative (−) terminal of the power source 220 to a negative (−) terminal of the marine display 230. In these instances, the second electrode terminal 254B of the power bus 246 is the negative (−) terminal of the marine display 230.

Further, in some implementations, when the marine display 230 is mounted, fastened, coupled, and/or attached to the bracket 110, the power source 220 provides power to the marine display 230 via the electrical circuit formed by the closed loop of the first wire or trace 350A, the second wire or trace 350B, the third wire or trace 352A, and the fourth wire or trace 352B. In these instances, the first and second electrical contacts 360A, 360B may be configured to further provide the closed loop circuit path or route between the power source 220 and the power bus 246 of the marine display 230 when the marine display 230 is mounted, fastened, coupled, and/or attached to the bracket 110.

Figure 4A:
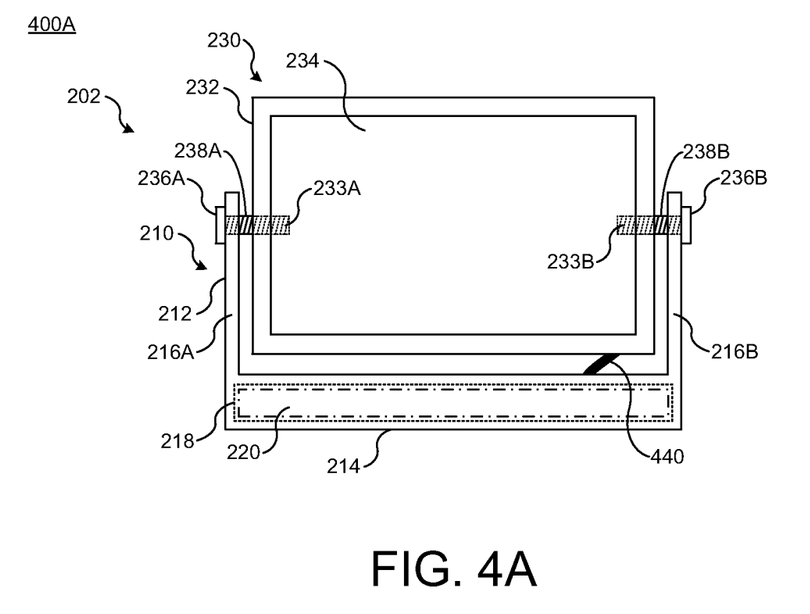
FIGS. 4A-4B illustrate various views of a mounting bracket assembly in accordance with various implementations described herein.
Figure 4B:
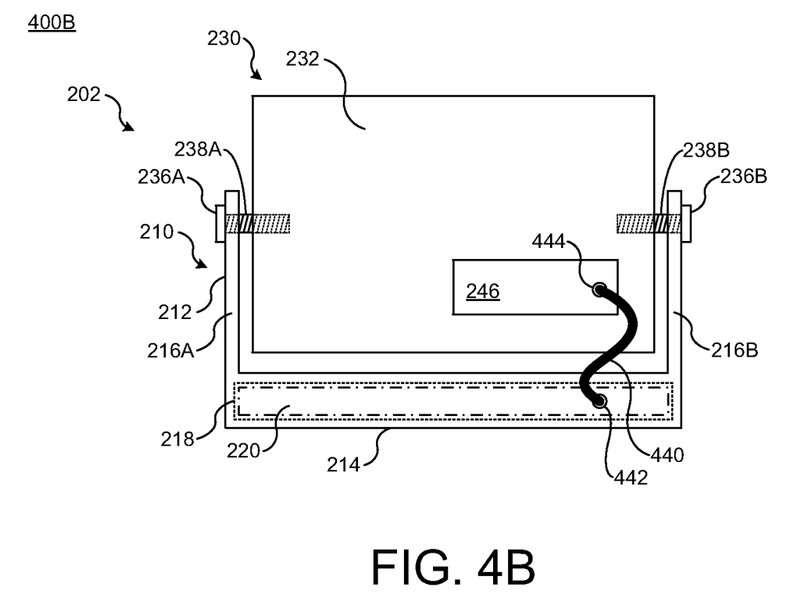

FIGS. 4A-4B illustrate various views of another embodiment of the mounting bracket assembly 202 in accordance with various implementations described herein. In particular, FIG. 4A illustrates a front view 400A of the mounting bracket assembly 202 and FIG. 4B illustrates a back view 400B of the mounting bracket assembly 202. The mounting bracket assembly 202 in FIGS. 4A-4B may have similar elements and/or components as those described with reference to FIGS. 2A-2F.

In FIGS. 4A-4B, the bracket 210 may comprise a housing 212 with an inner compartment 218 formed within an interior or internal region of the housing 212. As described herein, the bracket 210 may include a base member 214 having the inner compartment 218 formed therein, and the inner compartment 218 may be formed as a hollow cavity and configured to receive the power source 220. In this instance, the power source 220 may be configured to couple to the housing 212 within the inner compartment 218 of the base member 214.

In some implementations, as shown in FIGS. 4A-4B, an electrical circuit may be provided in the form of one or more conductive wires or cables 440 that may be configured to electrically connect the power source 220 to the marine display 230 for supply of power from the power source 220 to the marine display 230 via the power bus 246. In this instance, the conductive wire or cable 440 may be electrically connected to the power source 220 and configured to extend out from the inner compartment 118 through a first aperture 442 formed in the base member 214 of the housing 212 of the bracket 210. The conductive wire or cable 440 may further extend from the base member 214 of the housing 212 to a back portion of the display 230. The conductive wire or cable 440 may then extend through a second aperture 444 formed in the housing 232 of the marine display 230 and electrically connect to the power bus 246 of the marine display 230.

In some implementations, the conductive wire or cable 440 may be configured to electrically connect a positive (+) terminal of the power source 220 to a positive (+) terminal of the marine display 230, and further, the conductive wire or cable 440 may be configured to electrically connect a negative (−) terminal of the power source 220 to a negative (−) terminal of the marine display 230. The conductive wire or cable 440 may be configured to provide an electrical circuit that electrically connects the power source 220 to the marine display 230 via electrical connection between the positive (+) terminals of the power source 220 and the power bus 246 of the marine display 230 and between the negative (−) terminals of the power source 220 and the power bus 246 of the marine display 230. In some implementations, a first conductive wire may be connected between the positive (+) terminals of the power source 220 and the power bus 246 of the marine display 230, and a second conductive wire may be connected between the negative (−) terminals of the power source 220 and the power bus 246 of the marine display 230. In other implementations, a cable incorporating the first and second conductive wires may be used for this purpose.

Marine Electronics Device

Figure 5:
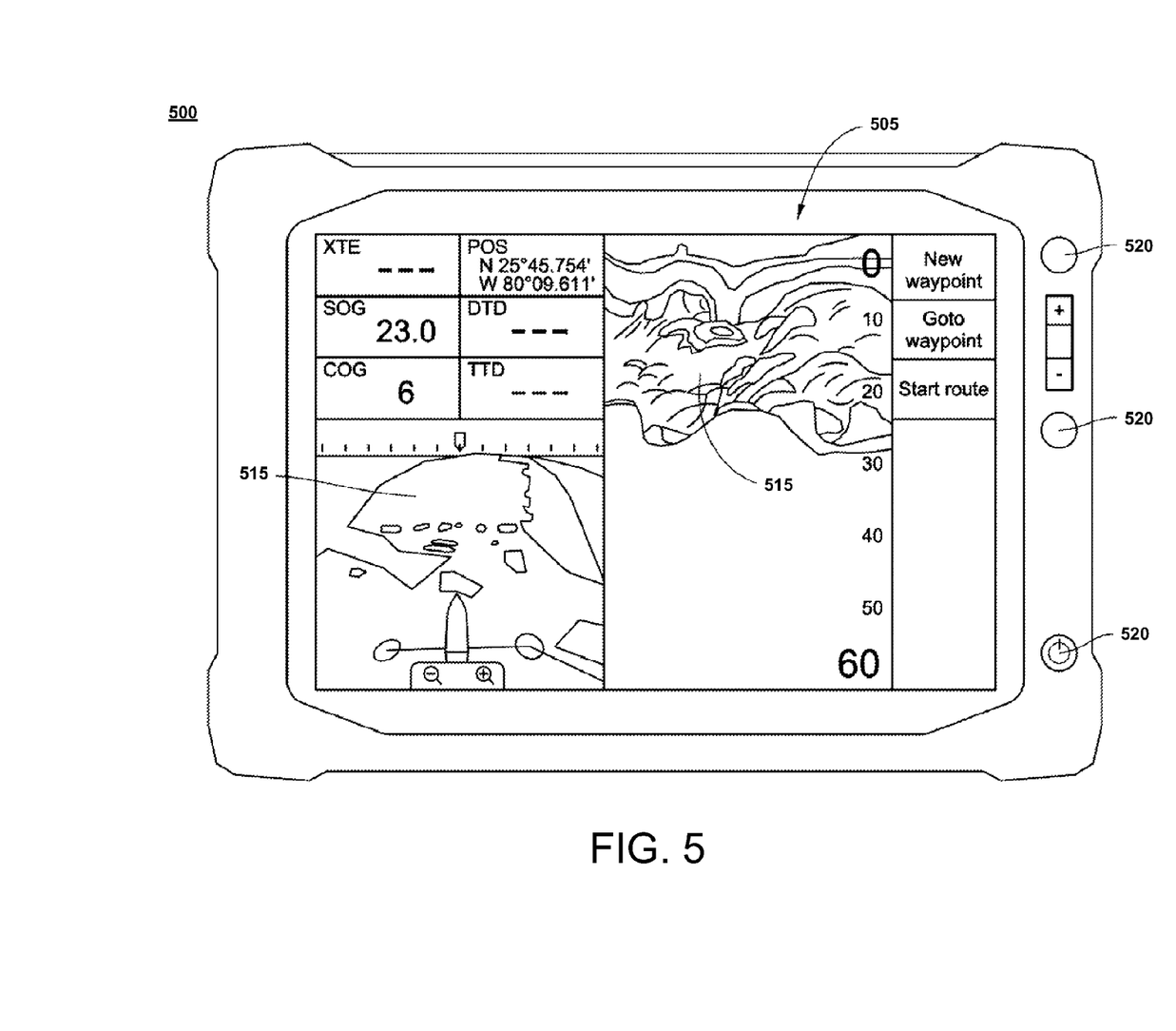
FIG. 5 illustrates a schematic of a marine electronics device in accordance with various implementations described herein.

FIG. 5 illustrates an instance schematic of a marine electronics device 500 in accordance with implementations of various techniques described herein. The marine electronics device 500 includes a screen 505. In some instances, the screen 505 may be sensitive to touching by a finger. In other instances, the screen 505 may be sensitive to the body heat from the finger, a stylus, or responsive to a mouse. In various implementations, the marine electronics device 500 may be attached to various buses and/or networks, such as, e.g., a National Marine Electronics Association (NMEA) bus or network. The marine electronics device 500 may send or receive data to or from another device attached to the NMEA 2000 bus. For instance, the marine electronics device 500 may transmit commands and receive data from a motor or a sensor using an NMEA 2000 bus. In some implementations, the marine electronics device 500 may be capable of steering a vessel and controlling the speed of the vessel, i.e., autopilot. For instance, one or more waypoints may be input to the marine electronics device 500, and the marine electronics device 500 may be configured to steer the vessel to the one or more waypoints. Further, the marine electronics device 500 may be configured to transmit and/or receive NMEA 2000 compliant messages, messages in a proprietary format that do not interfere with NMEA 2000 compliant messages or devices, and/or messages in any other format. In various other implementations, the marine electronics device 500 may be attached to various other communication buses and/or networks configured to use various other types of protocols that may be accessed via, e.g., NMEA 2000, NMEA 0183, Ethernet, Proprietary wired protocol, etc. In some implementations, the marine electronics device 500 may communicate with various other devices on the vessel or watercraft via wireless communication channels and/or protocols.

The marine electronics device 500 may be operational with numerous general purpose or special purpose computing system environments and/or configurations. The marine electronics device 500 may include any type of electrical and/or electronics device capable of processing data (including, e.g., various environmental sensor type data) and information via a computing system. The marine electronics device 500 may include various marine instruments, such that the marine electronics device 500 may use the computing system to display and/or process the one or more types of marine electronics data. The device 500 may display marine electronic data 515, such as, e.g., sensor data and images associated with sensor data. The marine electronic data types 515 may include various chart data, radar data, sonar data, steering data, dashboard data, navigation data, fishing data, engine data, and the like. The marine electronics device 500 may include one or more buttons 520, which may include physical buttons or virtual buttons, or some combination thereof. The marine electronics device 500 may receive input through a screen 505 sensitive to touch or buttons 520.

In some implementations, according to various techniques described herein, the marine electronics device 500 may be configured to simultaneously display images associated with one or more environmental sensors, an array of environmental sensors, and the like. For instance, the marine electronics device 500 may be configured to simultaneously display images associated with a plurality of environmental sensors, including environmental sensor data related to various environmental conditions of a column of water, such as, e.g., depth, pressure, chlorophyll concentration, oxygen concentration, temperature, light intensity, electrolyte concentration (e.g., salt content), acidity, etc. In some instances, in various display modes of operation, the marine electronics device 500 may be configured to simultaneously display images associated with environmental sensor data on the screen 505. Further, environmental data related to detected environmental conditions of water may be displayed on the screen 505 of the marine electronics device 500 by overlaying various environmental data on chart and sonar images. In some instances, various environmental data may include current levels of environmental conditions at particular depths, upper and lower boundary levels at particular depths, average levels through a water column, and any changes that occur throughout sensor use during a particular time period or interval.

The marine electronics device 500 may be configured as a computing system having a central processing unit (CPU), a system memory, a graphics processing unit (GPU), and a system bus that couples various system components including the system memory to the CPU. In various implementations, the computing system may include one or more CPUs, which may include a microprocessor, a microcontroller, a processor, a programmable integrated circuit, or a combination thereof. The CPU may include an off-the-shelf processor such as a Reduced Instruction Set Computer (RISC), or a Microprocessor without Interlocked Pipeline Stages (MIPS) processor, or a combination thereof. The CPU may also include a proprietary processor.

The GPU may be a microprocessor specifically designed to manipulate and implement computer graphics. The CPU may offload work to the GPU. The GPU may have its own graphics memory, and/or may have access to a portion of the system memory. As with the CPU, the GPU may include one or more processing units, and each processing unit may include one or more cores.

The CPU may provide output data to a GPU. Further, the GPU may generate user interfaces (UIs) including graphical user interfaces (GUIs) that provide, present, and/or display the output data. The GPU may also provide objects, such as menus, in the GUI. In some instances, a user may provide input by interacting with objects, and the GPU may receive input from interaction with objects and provide the received input to the CPU. Further, in some instances, a video adapter may be provided to convert graphical data into signals for a monitor, such as, e.g., a multi-function display (MFD) 500. The monitor (i.e., MFD 500) includes a screen 505. In various instances, the screen 505 may be sensitive to touch by a human finger, and/or the screen 505 may be sensitive to body heat from a human finger, a stylus, and/or responsive to a mouse.

The system bus may be any of several types of bus structures, including a memory bus or memory controller, a peripheral bus, and a local bus using any of a variety of bus architectures. By way of instance, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus. The system memory may include a read only memory (ROM) and a random access memory (RAM). A basic input/output system (BIOS), containing the basic routines that help transfer information between elements within the computing system, such as during start-up, may be stored in the ROM.

The computing system may further include a hard disk drive interface for reading from and writing to a hard disk, a memory card reader for reading from and writing to a removable memory card, and an optical disk drive for reading from and writing to a removable optical disk, such as a CD ROM or other optical media. The hard disk, the memory card reader, and the optical disk drive may be connected to the system bus by a hard disk drive interface, a memory card reader interface, and an optical drive interface, respectively. The drives and their associated computer-readable media may provide nonvolatile storage of computer-readable instructions, data structures, program modules and other data for the computing system.

Although the computing system is described herein as having a hard disk, a removable memory card and a removable optical disk, it should be appreciated by those skilled in the art that the computing system may also include other types of computer-readable media that may be accessed by a computer. For instance, such computer-readable media may include computer storage media and communication media. Computer storage media may include volatile and non-volatile, and removable and non-removable media implemented in any method or technology for storage of information, such as computer-readable instructions, data structures, program modules, software modules, or other data. Computer-readable storage media may include non-transitory computer-readable storage media. Computer storage media may further include RAM, ROM, erasable programmable read-only memory (EPROM), electrically erasable programmable read-only memory (EEPROM), flash memory or other solid state memory technology, CD-ROM, digital versatile disks (DVD), or other optical storage, magnetic cassettes, magnetic tape, magnetic disk storage or other magnetic storage devices, or any other medium which can be used to store the desired information and which can be accessed by the computing system. Communication media may embody computer readable instructions, data structures, program modules or other data in a modulated data signal, such as a carrier wave or other transport mechanism and may include any information delivery media. The term "modulated data signal" may mean a signal that has one or more of its characteristics set or changed in such a manner as to encode information in the signal. By way of instance, and not limitation, communication media may include wired media such as a wired network or direct-wired connection, and wireless media such as acoustic, radio frequency (RF), infrared (IR), and other wireless media. The computing system may include a host adapter that connects to a storage device via a small computer system interface (SCSI) bus, Fiber Channel bus, eSATA bus, or using any other applicable computer bus interface.

The computing system can also be connected to a router to establish a wide area network (WAN) with one or more remote computers. The router may be connected to the system bus via a network interface. The remote computers can also include hard disks that store application programs. In another implementation, the computing system may also connect to the remote computers via local area network (LAN) or the WAN. When using a LAN networking environment, the computing system may be connected to the LAN through the network interface or adapter. The LAN may be implemented via a wired connection or a wireless connection. The LAN may be implemented using Wi-Fi™ technology, cellular technology, Bluetooth™ technology, satellite technology, or any other implementation known to those skilled in the art. The network interface may also utilize remote access technologies (e.g., Remote Access Service (RAS), Virtual Private Networking (VPN), Secure Socket Layer (SSL), Layer 2 Tunneling (L2T), or any other suitable protocol). In some instances, these remote access technologies may be implemented in connection with the remote computers. It will be appreciated that the network connections shown are exemplary and other means of establishing a communications link between the computer systems may be used.

A number of program modules may be stored on the hard disk, memory card, optical disk, ROM or RAM, including an operating system, one or more application programs, and program data. In certain implementations, the hard disk may store a database system. The database system could include, for instance, recorded points. The application programs may include various mobile applications ("apps") and other applications configured to perform various methods and techniques described herein. The operating system may be any suitable operating system that may control the operation of a networked personal or server computer.

A user may enter commands and information into the computing system through input devices such as buttons, which may be physical buttons, virtual buttons, or combinations thereof. Other input devices may include a microphone, a mouse, or the like (not shown). These and other input devices may be connected to the CPU through a serial port interface coupled to system bus, but may be connected by other interfaces, such as a parallel port, game port or a universal serial bus (USB).

Certain implementations may be configured for connection to a GPS receiver system and/or a marine electronics device or system. The GPS system and/or marine electronics device or system may be connected via a network interface. For instance, the GPS receiver system may be used to determine position data for the vessel on which the marine electronics device 500 is disposed. Further, the GPS receiver system may transmit position data to the marine electronics device 500. In other instances, any positioning system known to those skilled in the art may be used to determine and/or provide the position data for the marine electronics device 500.

In various implementations, the marine electronics device or system may include one or more components disposed at various locations on a vessel. Such components may include one or more data modules, sensors, instrumentation, and/or any other devices known to those skilled in the art that may transmit various types of data to the marine electronics device 500 for processing and/or display. The various types of data transmitted to the marine electronics device 500 may include marine electronics data and/or other data types known to those skilled in the art. The marine electronics data received from the marine electronics device or system may include chart data, sonar data, structure data, radar data, navigation data, position data, heading data, automatic identification system (AIS) data, Doppler data, speed data, course data, or any other type known to those skilled in the art.

In one implementation, the marine electronics device or system may include a radar sensor for recording the radar data and/or the Doppler data, a compass heading sensor for recording the heading data, and a position sensor for recording the position data. In a further implementation, the marine electronics device or system may include a sonar transducer for recording the sonar data, an AIS transponder for recording the AIS data, a paddlewheel sensor for recording the speed data, and/or the like.

The marine electronics device 500 may receive external data via a LAN or a WAN. In some implementations, external data may relate to information not available from various marine electronics systems. The external data may be retrieved from the Internet or any other source. The external data may include atmospheric temperature, atmospheric pressure, tidal data, weather, temperature, moon phase, sunrise, sunset, water levels, historic fishing data, and/or various other fishing data.

In one implementation, the marine electronics device 500 may be a multi-function display (MFD) unit, such that the marine electronics device 500 may be capable of displaying and/or processing multiple types of marine electronics data. FIG. 5 illustrates a schematic diagram of an MFD unit in accordance with implementations of various techniques described herein. In particular, the MFD unit may include the computing system, the monitor (MFD 500), the screen 505, and the buttons such that they may be integrated into a single console.

The discussion of the present disclosure is directed to certain specific implementations. It should be understood that the discussion of the present disclosure is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of the implementations and combinations of elements of different implementations within the scope of the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort maybe complex and time consuming, but would nevertheless be a routine undertaking of design, fabrication, and manufacture for those of ordinary skill having benefit of this disclosure. Nothing in this application should be considered critical or essential to the claimed subject matter unless explicitly indicated as being "critical" or "essential."

Reference has been made in detail to various implementations, instances of which are illustrated in the accompanying drawings and figures. In the following detailed description, numerous specific details are set forth to provide a thorough understanding of the present disclosure. However, the present disclosure may be practiced without these specific details. In other instances, well-known methods, procedures, components, circuits and networks have not been described in detail so as not to unnecessarily obscure aspects of the embodiments.

It should also be understood that, although the terms first, second, etc. may be used herein to describe various elements, these elements should not be limited by these terms. These terms are only used to distinguish one element from another. For instance, a first object or step could be termed a second object or step, and, similarly, a second object or step could be termed a first object or step, without departing from the scope of the invention. The first object or step, and the second object or step, are both objects or steps, respectively, but they are not to be considered the same object or step.

The terminology used in the description of the present disclosure herein is for the purpose of describing particular implementations and is not intended to limit the present disclosure. As used in the description of the present disclosure and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. As used herein, the terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised without departing from the basic scope thereof, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as instance forms of implementing the claims.

What is claimed is:

1. A device, the device comprising: a bracket configured to removably mount a multi-function display to a marine vessel by a user, wherein the bracket comprises: a housing having a compartment for receiving a power source, and one or more mounting features configured to removably receive corresponding one or more mounting features of the multi-function display such that the multi-function display is removably mounted within the bracket, wherein the one or more mounting features of the bracket include a first electrode terminal in a first aperture configured to rotatably receive a first electrical contact of the multi-function display and a second electrode terminal in a second aperture configured to receive a second electrical contact of the multi-function display; and an electrical circuit configured to electrically connect the power source to the multi-function display through the one or more mounting features via electrical connection between the first electrode terminal and the first electrical contact and via electrical connection between the second electrode terminal and the second electrical contact when the multi-function display is mounted within the bracket with the one or more mounting features of the multi-function display received within the first and second apertures of the bracket.

2. The device of claim 1, wherein the housing comprises:
a base having the compartment,
a first arm extending from the base, wherein the first arm includes a first mounting feature of the one or more mounting features for coupling to a corresponding first mounting feature of the one or more mounting features of the multi-function display, and
a second arm extending from the base, wherein the second arm includes a second mounting feature of the one or more mounting features for coupling to a corresponding second mounting feature of the one or more mounting features connector of the multi-function display.

3. The device of claim 2, wherein the first mounting feature comprises a first mounting aperture and the first electrode integrated with the first
mounting aperture, and wherein the second mounting feature comprises a second mounting aperture and the a second electrode integrated with the second mounting aperture.

4. The device of claim 3, wherein the first electrode is configured to electrically connect with the first mounting feature of the multi-function display, and the second electrode is configured to electrically connect with the second mounting feature of the multi-function display.

5. The device of claim 3, wherein the first electrode electrically connects a positive terminal of the power source to a positive terminal of the multi-function display through the first mounting feature of the multi-function display, and wherein the second electrode electrically connects a negative terminal of the power source to a negative terminal of the multi-function display through the first mounting feature of the multifunction display.

6. The device of claim 1, wherein the electrical circuit is disposed within the housing.

7. The device of claim 1, wherein at least a portion of the electrical circuit is disposed outside of the housing.

8. The device of claim 1, wherein the power source comprises one or more rechargeable batteries coupled within the compartment of the housing.

9. A bracket, the bracket comprising: a base configured to removably mount a computing device to a watercraft by a user, the base having an inner compartment configured to receive a power source; a first member extending from the base, wherein the first member includes a first mounting feature for mounting a first part of the computing device to the base, wherein the first mounting feature includes a first aperture and a first electrode configured to rotatably receive a first connector of the computing device; a second member extending from the base, wherein the second member includes a second mounting feature for mounting a second part of the computing device to the base, wherein the second mounting feature includes a second aperture and a second electrode configured to rotatably receive a second connector of the computing device; and an electrical circuit configured to electrically connect the power source to the computing device when the computing device is mounted within the bracket via electrical connection between the first electrode of the first mounting feature and the first connector of the computing device and via electrical connection between the second electrode of the second mounting feature and the second connector of the computing device.

10. The bracket of claim 9, wherein the first electrode of the first mounting feature electrically connects a positive terminal of the power source to a positive terminal of the computing device when the computing device is mounted within the bracket, and wherein the second electrode of the second mounting feature electrically connects a negative terminal of the power source to a negative terminal of the computing device when the computing device is mounted within the bracket.

11. The bracket of claim 9, wherein the power source comprises one or more batteries coupled within the inner compartment of the base.

12. The bracket of claim 9, wherein the base is detachably mounted to the watercraft.

13. A bracket, the bracket comprising: a base member configured to removably fasten a marine display to a watercraft by a user, the base member having an interior compartment configured to receive a power source; at least one arm member extending from the base member, wherein the at least one arm member includes at least one mounting feature for mounting at least a portion of the marine display to the base member, wherein the at least one mounting feature includes a first electrode terminal in an aperture configured to electrically connect to a first electrical contact of the marine display and a second electrode terminal in the aperture configured to electrically connect to a second electrical contact of the marine display when the marine display is rotatable mounted within the bracket; and an electrical circuit configured to electrically connect the power source to the marine display when the marine display is mounted within the bracket via electrical connection between the first electrode terminal and the first electrical contact and via electrical connection between the second electrode terminal and the second electrical contact.

14. The bracket of claim 13, wherein the first electrode terminal electrically connects a positive terminal of the power source to a positive terminal of the marine display via the first electrical contact, and wherein the second electrode terminal electrically connects a negative terminal of the power source to a negative terminal of the marine display via the second electrical contact.

15. The bracket of claim 13, wherein the at least one mounting feature comprises a mounting aperture with the first and second electrode terminals integrated therewith, and wherein the first and second electrode terminals are electrically isolated.

16. The bracket of claim 13, wherein the electrical circuit comprises first and second wires embedded within the at least one arm member, the first wire electrically connecting a first terminal of the power source to the first electrode terminal, and the second wire electrically connecting a second terminal of the power source to the second electrode terminal.

17. The bracket of claim 13, wherein the power source comprises a rechargeable power source coupled within the interior compartment of the base member.

18. The device of claim 1, wherein the one or more mounting features of the multifunction display are formed of an electrically conductive material that provides a conductive path between the power source and the multi-function display.

19. The bracket of claim 9, wherein the first mounting feature and the second mounting feature of the computing device are each formed of an electrically conductive material that provides a conductive path between the power source and the computing device.

20. The bracket of claim 13, wherein the at least one mounting feature of the marine display is formed of an electrically conductive material that provides a conductive path between the power source and the marine display.

* * * * *

UNITED STATES PATENT AND TRADEMARK OFFICE
CERTIFICATE OF CORRECTION

PATENT NO. : 9,549,478 B2  Page 1 of 1
APPLICATION NO. : 14/628157
DATED : January 17, 2017
INVENTOR(S) : Matthew Laster It is certified that error appears in the above-identified patent and that said Letters Patent is hereby corrected as shown below:

In the Claims
Claim 13, Column 16, Line 10 "display is rotatable mounted within the bracket; and an" should read
-- display is rotatably mounted within the bracket; and an --

Signed and Sealed this
Seventh Day of March, 2017

Michelle K. Lee
*Director of the United States Patent and Trademark Office*